US009691980B1

(12) United States Patent
Lin et al.

(10) Patent No.: US 9,691,980 B1
(45) Date of Patent: Jun. 27, 2017

(54) METHOD FOR FORMING MEMORY DEVICE

(71) Applicant: Winbond Electronics Corp., Taichung (TW)

(72) Inventors: Chia-Hung Lin, Taichung (TW); Lih-Wei Lin, Hsinchu (TW); I-Hsien Tseng, Zhubei (TW); Tsung-Huan Tsai, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 15/332,393

(22) Filed: Oct. 24, 2016

(30) Foreign Application Priority Data

Aug. 18, 2016 (CN) .......................... 2016 1 0682869

(51) Int. Cl.
| | | |
|---|---|---|
| *H01L 45/00* | (2006.01) | |
| *G11C 13/00* | (2006.01) | |
| *G11C 29/04* | (2006.01) | |
| *H01L 21/66* | (2006.01) | |

(52) U.S. Cl.
CPC ........ *H01L 45/1641* (2013.01); *G11C 13/004* (2013.01); *G11C 13/0097* (2013.01); *G11C 29/04* (2013.01); *H01L 22/20* (2013.01); *H01L 45/146* (2013.01); *H01L 45/1608* (2013.01)

(58) Field of Classification Search
CPC ................................ H01L 21/00; H01L 31/08
See application file for complete search history.

(56) References Cited

U.S. PATENT DOCUMENTS

| | | | |
|---|---|---|---|
| 8,054,674 B2 | 11/2011 | Tamai et al. | |
| 8,345,483 B2 * | 1/2013 | Neumeyer | G11C 7/14 365/185.18 |
| 8,472,237 B2 | 6/2013 | Oh et al. | |
| 9,183,930 B2 * | 11/2015 | Perniola | G11C 13/0007 |
| 2008/0239820 A1 * | 10/2008 | Wang | G11C 8/08 365/185.17 |
| 2008/0241968 A1 * | 10/2008 | Fujii | H01L 21/28282 438/4 |
| 2008/0268659 A1 * | 10/2008 | Wu | G11C 16/3454 438/795 |

(Continued)

FOREIGN PATENT DOCUMENTS

| | | |
|---|---|---|
| CN | 102099863 B | 4/2014 |
| TW | 201543485 A | 11/2015 |

*Primary Examiner* — Caridad Everhart
*Assistant Examiner* — Ankush Singal
(74) *Attorney, Agent, or Firm* — Muncy, Geissler, Olds & Lowe, P.C.

(57) ABSTRACT

A method for forming a memory device is provided. The method includes forming a plurality of memory cells. The method also includes performing a first baking on the memory cells. The method further includes setting a specified current, and after performing the first baking, performing a test process on the memory cells. The test process includes reading the current of the memory cells. When the read current of the memory cells is larger than or equal to the specified current, the test process of the memory cell is done. When the read current of the memory cells is smaller than the specified current, a re-forming process is performed on the memory cells to form a plurality of re-formed memory cells, and then the test process is performed on the re-formed memory cells.

10 Claims, 3 Drawing Sheets

(56) References Cited

U.S. PATENT DOCUMENTS

| | | | | |
|---|---|---|---|---|
| 2009/0276075 A1* | 11/2009 | Good | ............... | G06Q 10/06 700/110 |
| 2010/0015785 A1* | 1/2010 | Jeong | ............ | G11C 13/0004 438/466 |
| 2011/0317480 A1* | 12/2011 | Lung | ............ | G11C 13/0004 365/163 |
| 2012/0300532 A1 | 11/2012 | Yamazaki et al. | | |
| 2013/0114337 A1* | 5/2013 | Markov | ............ | G11C 29/50 365/185.3 |
| 2014/0254240 A1* | 9/2014 | Perniola | ......... | G11C 13/0007 365/148 |
| 2015/0095728 A1* | 4/2015 | Lu | ..................... | G11C 29/04 714/721 |
| 2015/0287919 A1* | 10/2015 | Lin | ..................... | H01L 45/08 438/382 |
| 2015/0357046 A1* | 12/2015 | Tarsi | ................. | G11C 29/44 714/721 |
| 2016/0020388 A1* | 1/2016 | Wang | ............... | H01L 45/08 257/3 |

* cited by examiner

METHOD FOR FORMING MEMORY DEVICE

CROSS REFERENCE TO RELATED APPLICATIONS

This Application claims priority of China Patent Application No. 201610682869.8, filed on Aug. 18, 2016, the entirety of which is incorporated by reference herein.

BACKGROUND OF THE INVENTION

Field of the Invention

The disclosure relates to memory devices and in particular to formation methods of resistive random-access memory (RRAM) devices.

Description of the Related Art

Recently, a variety of consumer electronic products have become popular, increasing the demand for non-volatile memory devices. Flash memory is a mainstream non-volatile memory device. However, since the size of the devices continues to shrink, flash memory devices have encountered issues such as high operation voltages, slow operation speeds, and bad data retention ability. As a result, future development of the flash memory device is limited.

Therefore, many materials and apparatuses of new types of non-volatile memory devices are under development. New types of non-volatile memory devices include, for example, magnetic random access memory (MRAM) devices, phase change memory (PCM) devices, and resistive random access memory (RRAM) devices. Among these non-volatile memory devices, RRAM devices have many advantages such as low power consumption, low operation voltages, short write and erase times, high reliability, long memory time, non-destructive read-out, multi-state memory, process simplicity, and only a small area is required.

However, the biggest problem for non-volatile resistive random access memory is that the material properties and composition of the structure cannot endure high temperatures, raising concerns about data retention in non-volatile resistive random access memory. So further improve is still needed in the yield rate and efficiency of RRAM devices.

BRIEF SUMMARY OF THE INVENTION

Some embodiments of the disclosure provide a method for forming a memory device. The method includes forming a plurality of memory cells and performing a first baking on the memory cells. The method also includes setting a specified current and after performing the first baking, performing a test process on the memory cells. The test process includes reading the current of the memory cells. When the read current of the memory cells is larger than or equal to the specified current, the test process of the memory cells is done. When the read current of the memory cells is smaller than the specified current, a re-forming process is performed on the memory cells to form a plurality of re-formed memory cells, and then the test process is performed on the re-formed memory cells.

DETAILED DESCRIPTION OF THE INVENTION

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first material layer over or on a second material layer in the description that follows include embodiments in which the first and second material layers are formed in direct contact, and may also include embodiments in which additional material layers may be formed between the first and second material layers, so that the first and second material layers may not be in direct contact. Some variations of the embodiments are described. Throughout the various views and illustrative embodiments, like reference numbers are used to designate like elements.

Figure 1A:
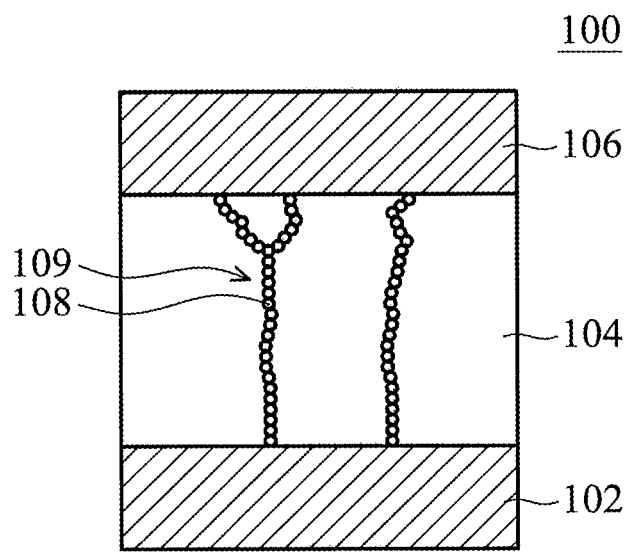
FIG. 1A is a cross-sectional view of a memory cell of a memory device in a low resistance status in accordance with some embodiments of the disclosure.
Figure 1B:
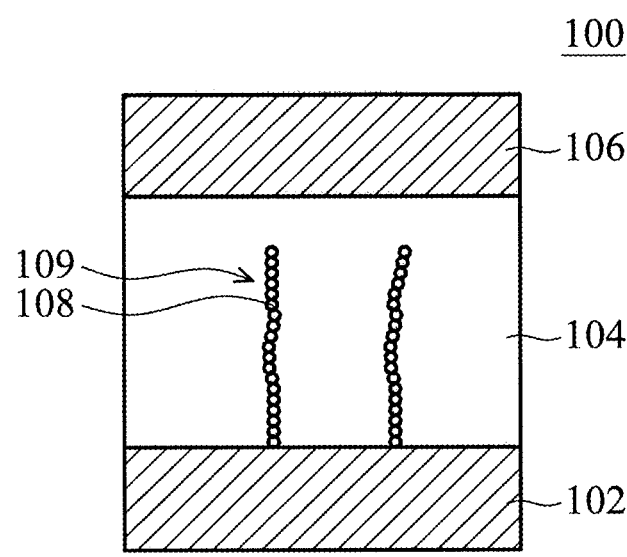
FIG. 1B is a cross-sectional view of a memory cell of a memory device in a high resistance status in accordance with some embodiments of the disclosure.

FIG. 1A is a cross-sectional view of a memory cell of a memory device in a low-resistance status in accordance with some embodiments of the disclosure. FIG. 1B is a cross-sectional view of a memory cell of a memory device in a high-resistance status in accordance with some embodiments of the disclosure. In some embodiments, the memory device is a resistive random access memory (RRAM) device. The memory device includes multiple memory cells like the memory cell 100 which shown in FIG. 1A and FIG. 1B. These memory cells are arranged in an array and each of the memory cells 100 includes an electrode 102, an electrode 106, and a resistance-switching layer 104 located between the electrode 102 and the electrode 106.

In some embodiments, the memory cell 100 includes an electrode 102 formed over a substrate (not shown). The substrate may include a semiconductor substrate or other suitable substrates. In some embodiments, the substrate is a semiconductor wafer, such as a silicon wafer. In some embodiments, the material of the electrode 102 includes metal, metal nitride, or alloy. For example, the material of the electrode 102 is titanium nitride (TiN), platinum (Pt), aluminum copper (AlCu), titanium (Ti), gold (Au), tantalum (Ta), tantalum nitride (TaN), tungsten (W), tungsten nitride (WN), copper (Cu), other suitable conductive material, or a combination thereof. In some embodiments, a conductive material is deposited over the substrate and then the conductive material is patterned by using a patterning process to form a desired electrode pattern so as to form the electrode 102. In some embodiments, the conductive material is deposited by using a physical vapor deposition (PVD) process, an electroplating process, a chemical vapor deposition process (CVD), a spin coating process, another applicable process, or a combination thereof. The patterning process includes a photolithography and etching process.

Afterwards, the resistance-switching layer 104 is formed over the electrode 102 in some embodiments. The material of the resistance-switching layer 104 may include oxides, oxynitrides, or other suitable dielectric materials. For example, the resistance-switching layer 104 is made of hafnium oxide, zirconium oxide, titanium oxide, tantalum oxide, tungsten oxide, aluminum oxide, zinc oxide, nickel oxide, copper oxide, titanium oxynitride, or another suitable material. In some embodiments, the material used for the resistance-switching layer 104 is deposited over the electrode 102 by an atomic layer deposition (ALD) process, a chemical vapor deposition (CVD) process, a physical vapor deposition (PVD) process, a spin coating process, a spray coating process, another applicable process, or a combination thereof. Then the deposited material using used for the resistance-switching layer is patterned to form the resistance-switching layer 104. In some embodiments, the resistance-switching layer 104 is doped with other elements, such as boron or phosphorus.

Afterwards, an electrode 106 is formed over the resistance-switching layer 104 in some embodiments. The material of the electrode 106 may be the same as or different from that of electrode 102 which includes metal, metal nitride, or an alloy. In some embodiments, the electrode 106 is made of titanium nitride (TiN), platinum (Pt), aluminum copper (AlCu), titanium (Ti), gold (Au), tantalum (Ta), tantalum nitride (TaN), tungsten (W), tungsten nitride (WN), copper (Cu), another suitable conductive material, or a combination thereof. The process of forming electrode 102 mentioned above can be used to form electrode 106.

Embodiments of the disclosure may have many variations. For example, in some embodiments, other material layers may be formed between electrode 102, electrode 106, and the resistance-switching layer 104. For example, a buffer layer and/or a barrier layer (not shown) can be formed there between.

In some embodiments, the resistance-switching layer 104 is made of a dielectric material and the material of the resistance-switching layer 104 is usually electrically insulating. In some embodiments, some treatments need to be performed to activate the memory cells. In some embodiments, the electrical conductivity of the resistance-switching layer 104 may be increased after a sufficiently high forming voltage ($V_f$) is applied thereon using a process to form one or more conductive filaments 109 in the resistance-switching layer 104. Due to the application of voltage, there is a series of vacancies 108 formed in the resistance-switching layer 104. The vacancies 108 are, for example, oxygen vacancies or nitrogen vacancies. The vacancies 108 may be increased gradually by increasing the applied voltage. When the applied voltage is increased to the level of the forming voltage ($V_f$), these vacancies 108 are connected in series to become the conductive filament 109 to connect electrode 102 with electrode 106 so as to form a conductive path. As a result, the resistance of the resistance-switching layer 104 can be decreased significantly. The current passing through the resistance-switching layer 104 may be increased significantly to form a low resistance status, as shown in FIG. 1A.

In some embodiments, a reverse voltage is applied to the resistance-switching layer 104 such that the resistance of the resistance-switching layer 104 is increased. The reverse voltage can cause some of the vacancies 108 to disappear, partially breaking the conductive filament 109. Therefore, the conductive filament 109 formed by the vacancies 108 between electrode 102 and electrode 106 disappears. As a result, the resistance of the resistance-switching layer 104 is increased. The current passing through the resistance-switching layer 104 is thereby decreased to form a high-resistance status, as shown in FIG. 1B. In some embodiments, the resistance status of the resistance-switching layer 104 may be adjusted through the application of voltage. Therefore, data can be stored in the resistance-switching layer 104. By detecting the current passing through the resistance-switching layer 104, the resistance information of the resistance-switching layer 104 can be obtained so as to retrieve the desired storage data.

In some memory cells of a memory device, there are some weak or unstable conductive filaments, or some conductive filaments which can easily disappear in a high-temperature environment. This kind of conductive filament may decrease or disappear due to the following high-temperature process (for example a baking process) to cause tailing memory cells or this kind of unstable conductive filaments which are formed in the forming process may resulted in weak memory cells. These defects in the memory cells not only cause the current of the memory cells to decrease or fall, but also lower the performance of the memory device. The currents of the memory cells include a set current and a reset current. The set current is the read current of a memory cell when a set voltage is applied to the memory cell to make the memory cell switch to a low-resistance status. The reset current is the read current of a memory cell when a reset voltage is applied to the memory cell to make the memory cell switch to a high-resistance status. These defects in the memory cells may cause the set current of the memory cells to decrease, or cause the distribution range of the reset current of the memory cells to become wider, resulting in the set current and the reset current of the memory cell not being clearly distinguishable, which can cause errors to appear in the data in the memory cells, and therefore the data retention ability of the memory cells becomes lower.

Figure 2:
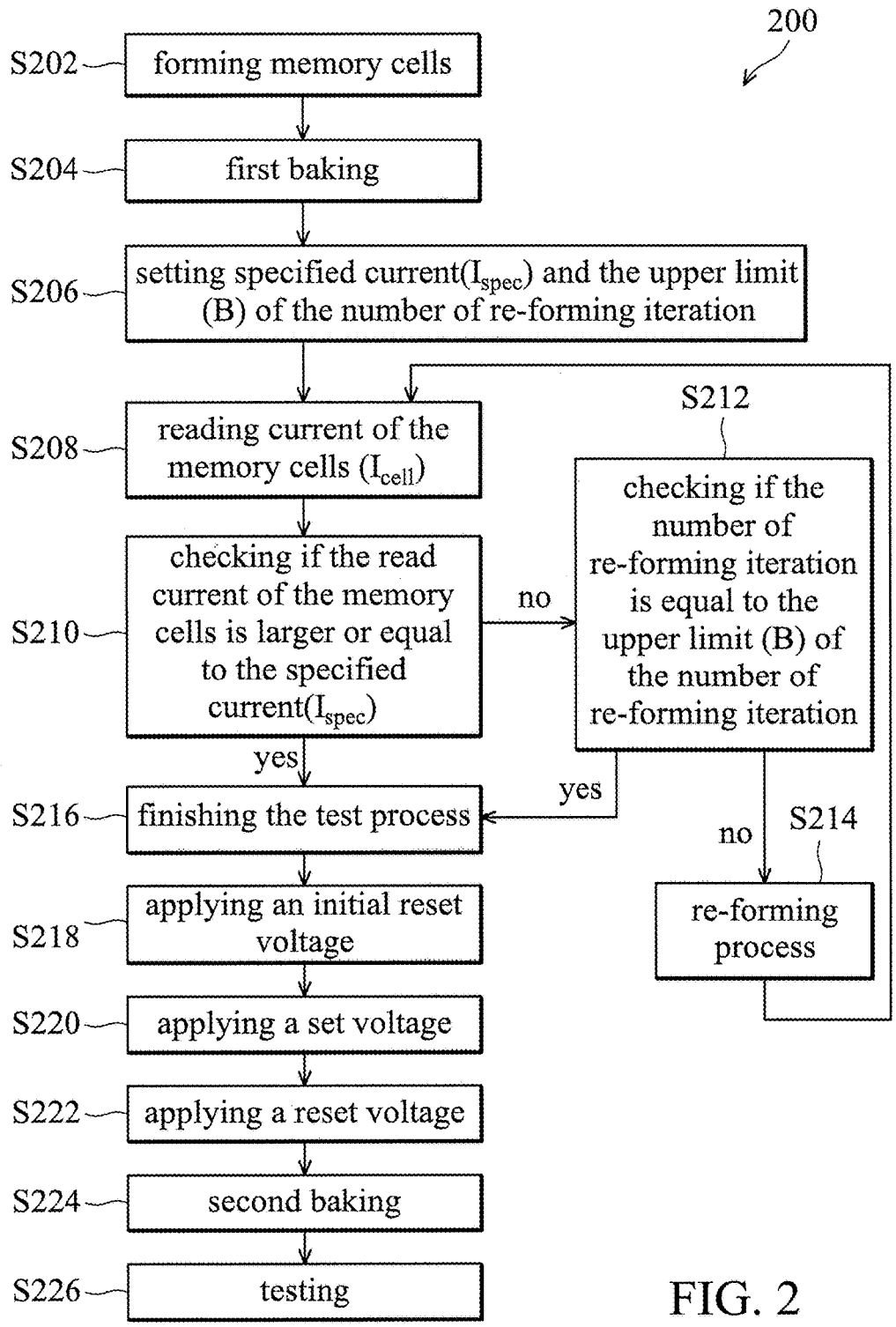
FIG. 2 is a flow chart of a method for forming a memory device in accordance with some embodiments of the disclosure.

FIG. 2 is a flow chart of a method 200 for forming a memory device in accordance with some embodiments of the disclosure. In some embodiments, the method 200 begins with step S202 in which a forming voltage ($V_f$) is applied to two electrodes to form a plurality of memory cells. That is, a forming process of the memory cells is performed. In some embodiments, the forming voltage is applied by graded voltages. For example, a voltage, which is lower than the forming voltage ($V_f$), is applied first followed by another application of the forming voltage ($V_f$). Applying the forming voltage by graded voltages can improve the performance of the memory device. Thus, the set current of the memory device can be more stable.

The method 200 continues in step S204 in which a first baking is performed on the memory cells. The time and temperature of the first baking can be adjusted according to the material of the resistance-switching layer of the memory cells. In some embodiments, the temperature of the first baking is in a range between 260° C. and 280° C. In some embodiments, the time required for the first baking is in a range between 150 seconds and 300 seconds.

Afterwards, the method 200 continues to step S206. In some embodiments, the specified current ($I_{spec}$) and the upper limit B of the number of re-forming iteration are set in step S206. The specified current ($I_{spec}$) is set to select the weak memory cells and the tailing memory cells from among the plurality of memory cells. If the specified current is assigned a relatively high value within the distribution range of the read currents of the memory cells, more weak memory cells and tailing memory cells can be selected out from the plurality of memory cells, thereby further improving the yield rate of the memory cells. In some embodiments, the specified current is set at, for example, 8 µA and the upper limit B of the number of re-forming iteration is normally set at, for example, 4 times.

Afterwards, in the method 200, step S208 to step S216 is a test process. The method 200 continues to step S208 in which the current of the memory cells is read. Then the method 200 continues to step S210 in which the read current of the memory cells is checked to see if it is larger than the specified current set in step S206, thereby selecting out those weak memory cells and tailing memory cells. In some embodiments, when the read current of the memory cells is larger or equal to the specified current (for example, 8 µA) mentioned above, the method 200 can proceed to step S216, which means that the test process of these memory cells is finished. In some embodiments, when the read current of the memory cells is smaller than the specified current (for example, 8 µA) mentioned above, the weak memory cells or tailing memory cells are selected out of the plurality of memory cells. At the time, the method 200 continues to step S212, in which a check is made as to whether the number of re-forming iteration of the memory cells has reached the upper limit B of the number of re-forming iteration set in step S206. If the number of re-forming iteration is smaller than the upper limit B of the number of re-forming iteration set previously, then the method 200 proceeds to the re-forming process in step S214. If the number of re-forming iteration of the memory cells is equal to the upper limit B of the number of re-forming iteration set previously, then the method 200 skips step S214 and proceeds to step S216. That is, finishing the test process.

In step S214 mentioned above, the weak memory cells and tailing memory cells are selected out of the plurality of memory cells to have the re-forming process performed on them, which recovers these weak memory cells and tailing memory cells so as to improve the yield rate of the plurality of memory cells. In some embodiments, the re-forming process of step S214 is to apply the same forming voltage ($V_f$) as the voltage applied in step S202 to these weak memory cells and tailing memory cells. In some embodiments, the forming voltage applied in the re-forming process in step S214 may be higher than or lower than the forming voltage ($V_f$) of step S202 according to the falling degree between the read currents of the tailing memory cells and the specified current set in the step S206 or the weaken degree of the conductive filaments in the weak memory cells.

In some embodiments, after the re-forming process of step S214 is performed, the method 200 returns to step S208 to read the current of the memory cells, and returns to step S210 to compare the read current of the memory cells and the specified current. Also, method 200 returns to step S212 to check if the number of re-forming iteration of the memory cells has reached the upper limit B of the number of re-forming iteration. Then, in step S214 the re-forming process is performed until all the memory cells continue to step S216 to finish the test process.

In some embodiments, the test process from step S208 to step S216 is performed to select out the weak memory cells and the tailing memory cells of the plurality of memory cells. In some embodiments, the test process from step S208 to step S216 is to select out the weak memory cells and the tailing memory cells of the plurality of memory cells to reduce the high-temperature data-retention (HTDR) falling rate and bit error rate (BER) of the memory cells in the memory device.

Afterwards, the method 200 continues to step S218 in which an initial reset voltage is applied to the memory cells. In some embodiments, a reverse initial reset voltage is applied to the resistance-switching layer 104 so that the resistance of the resistance-switching layer 104 increases and returns to the high-resistance status to perform an initial reset.

In some embodiments, afterwards, the method 200 continues to step S220 in which a set voltage is applied to the memory cells so that the resistance of the resistance-switching layer 104 reduces and transforms the high-resistance status into a low-resistance status. In some embodiments, the set voltage and the forming voltage in step S202 have the same polarity. In some embodiments, the set voltage and the initial reset voltage in step S218 have opposite polarities.

In some embodiments, then, the method 200 continues to step S222 in which a reset voltage is applied to the memory cells so that the resistance of the resistance-switching layer 104 increases again and transforms the low-resistance status into a high-resistance status. In some embodiments, multiple applications of the reset voltage and the set voltage to the memory cells are performed to improve the performance of the memory cells.

Afterwards, the method 200 continues to step S224 in which a second baking if performed on the memory cells. Unlike the first baking, the second baking may be used to simulate a situation wherein the memory cell has been operating for a long time, to test the reliability of the memory cells (that is also called a retention test). For example, a wafer having a number of memory cells may be baked at a temperature of about 170° C. for about 24 hours. In some embodiments, the duration of the second baking is longer than that of the first baking. In some embodiments, the temperature range of the second baking is lower than the temperature range of the first baking.

In some embodiments, the first baking process in step S204, the setting of the specified current and the upper limit B of the number of re-forming iteration in step S206, and the test process from step S208 to step S216 can be performed after the memory cells are formed in step S202 and before the initial reset voltage is applied in step S218.

In some embodiments, the first baking process in step S204, the setting of the specified current and the upper limit B of the number of re-forming iteration in step S206, and the test process from step S208 to step S216 can be performed after the initial reset voltage is applied in step S218 and before the set voltage is applied in step S220.

In some embodiments, the first baking process in step S204, the setting of the specified current and the upper limit B of the number of re-forming iteration in step S206, and the test process from step S208 to step S216 can be performed after the set voltage is applied in step S220 and before the reset voltage is applied in step S222.

In some embodiments, the first baking process in step S204, the setting of the specified current and the upper limit B of the number of re-forming iteration in step S206, and the testing process from step S208 to step S216 can be performed after the reset voltage is applied in step S222 and before the second baking is performed in step S224.

Afterwards, the method 200 continues with step S226 in which an electrical testing operation is performed on the memory cells which were baked by the second baking in step S224. For example, the read current of each of the memory cells in the wafer which have been treated through the first baking and the second baking can be obtained by the electrical testing operation. The read current is for example, the set current (Iset) or the reset current (Ireset) of the memory cells.

Some embodiments of the disclosure provide a forming method of a memory device which can improve the manufacturing yield rate of memory cells. Unlike the previous manufacturing process, by adding a first baking process, a test process and a re-forming process, the weak or tailing memory cells can be selected out of plurality of memory cells earlier. In some embodiments of the disclosure, a decision can be made as to which memory cells need to perform the re-forming process which can significantly reduce the high-temperature data-retention (HTDR) falling rate of the low-resistance status of the memory cells. Some embodiments of the disclosure can improve the set current of the memory cells which have been falling or can improve the set current distribution range which has become wider due to thermal stress. The above problems of memory cells lead to difficulties in distinguishing the set current and the reset current. This means that when the set current and the reset current are hard to distinguish, there are some problems with reading error to the data retention ability. Some embodiments of the disclosure can also strengthen the conductive filaments in the memory cells so that the electrical of the resistance-switching layer becomes more stable, which can improve the performance of the memory device and increase the manufacturing yield rate of the memory cells.

Figure 3:
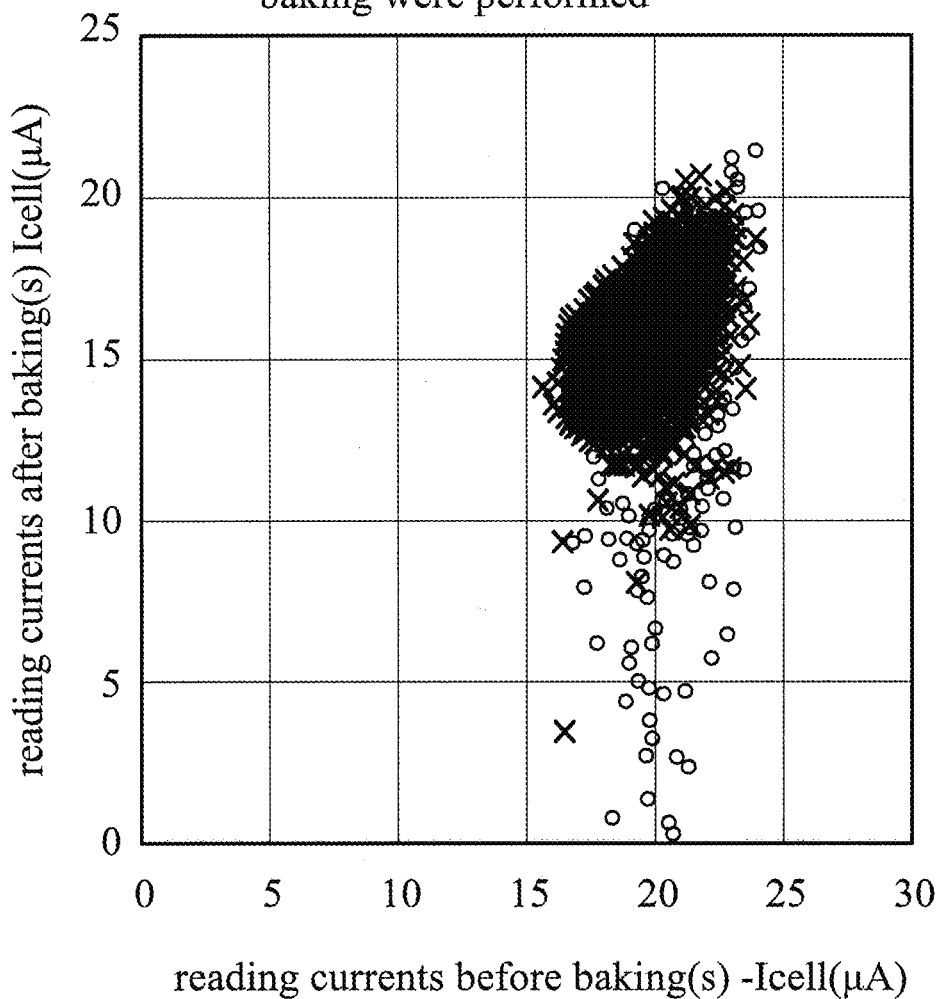
FIG. 3 shows a distribution graph of the read currents of memory cells of a memory device after performing only the second baking and after performing both the first baking and the second baking in accordance with some embodiments of the disclosure.

FIG. 3 shows a distribution graph of the relationship between the read currents of memory cells of a memory device on which only the second baking was performed and those on which both the first and second baking were performed, in accordance with some embodiments of the disclosure. In FIG. 3, the horizontal axis represents the read currents of the memory cells before only the second baking, or before both the first baking and the second baking, were performed. The vertical axis represents the read currents of the memory cells after only the second baking, or after both the first baking and the second baking, were performed. In FIG. 3, the hollow round sign represents the current distribution of the memory cells on which only the second baking was performed. The crosses sign represents the current distribution of the memory cells on which both the first baking and the second baking were performed. From FIG. 3, it can be seen that the current distribution of the memory cells on which only the second baking was performed is wider, which is in a range between 0 and 25 µA. The current distribution of the one on which both the first baking and the second baking were performed is more concentrated, which is in a range between 10 µA and 20 µA. This means that the memory cells which are treated with both the first baking and the second baking are not affected by the following high-temperature process, thus the decrease of the set current and the wider distribution of the reset current do not occur.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments described in the specification.

What is claimed is:

1. A method for forming a memory device, comprising:
    forming a plurality of memory cells;
    performing a first baking on the memory cells;
    setting a specified current; and
    after performing the first baking, performing a test process on the memory cells, wherein the test process comprises:
    reading a current of the memory cells, wherein when the read current of the memory cells is larger than or equal to the specified current, the test process of the memory cells is finished, or when the read current of the memory cells is smaller than the specified current, performing a re-forming process on the memory cells to form a plurality of re-formed memory cells, and performing the test process on the re-formed memory cells.

2. The method as claimed in claim 1, further comprising:
    applying an initial reset voltage to the memory cells;
    applying a set voltage to the memory cells after the initial reset voltage is applied;
    applying a reset voltage to the memory cells after the set voltage is applied; and
    performing a second baking on the memory cells after the reset voltage is applied.

3. The method as claimed in claim 2, wherein after the reset voltage is applied to the memory cells and before the second baking, the first baking, setting the specified current and the test process are performed on the memory cells.

4. The method as claimed in claim 2, wherein before applying the reset voltage to the memory cells and after the set voltage is applied to the memory cells, the first baking, setting the specified current and the test process are performed on the memory cells.

5. The method for forming a memory device as claimed in claim 2, wherein before applying the set voltage to the memory cells and after the initial reset voltage is applied to the memory cells, the first baking, setting the specified current, and the test process are performed on the memory cells.

6. The method as claimed in claim 2, wherein after the memory cells are formed and before applying the initial reset voltage to the memory cells, the first baking, setting the specified current and the test process are performed on the memory cells.

7. The method as claimed in claim 2, wherein a temperature range of the second baking is lower than that of the first baking.

8. The method for forming a memory device as claimed in claim 2, wherein a time of the second baking is longer than that of the first baking.

9. The method for forming a memory device as claimed in claim 7, wherein the temperature range of the first baking is between 260° C. and 280° C.

10. The method for forming a memory device as claimed in claim 1, further comprising setting an upper limit of a number of re-forming iteration, and wherein the test process further comprises checking the number of re-forming iteration of the memory cells, wherein when the number of re-forming iteration is equal to the upper limit of the number of re-forming iteration, then the test process of the memory cells is ended, or when the number of re-forming iteration is less than the upper limit of the number of re-forming iteration, then the re-forming process is performed on the memory cells, and the test process is performed again on the memory cells.

* * * * *